United States Patent
Hammerschmidt

(10) Patent No.: US 10,958,260 B1
(45) Date of Patent: Mar. 23, 2021

(54) PULSE-WIDTH MODULATION WITH REDUCED TRANSMISSION LATENCY

(71) Applicant: Infineon Technologies AG, Neubiberg (DE)

(72) Inventor: Dirk Hammerschmidt, Finkenstein (AT)

(73) Assignee: Infineon Technologies AG

( * ) Notice: Subject to any disclaimer, the term of this patent is extended or adjusted under 35 U.S.C. 154(b) by 0 days.

(21) Appl. No.: 16/839,223

(22) Filed: Apr. 3, 2020

(51) Int. Cl.
*H03K 7/08* (2006.01)
*H04L 25/49* (2006.01)

(52) U.S. Cl.
CPC ........... *H03K 7/08* (2013.01); *H04L 25/4902* (2013.01)

(58) Field of Classification Search
CPC .............................. H03K 7/08; H04L 25/4902
See application file for complete search history.

(56) References Cited

U.S. PATENT DOCUMENTS

| | | | |
|---|---|---|---|
| 10,530,344 B1* | 1/2020 | Nene | H03K 5/00006 |
| 2008/0079407 A1 | 4/2008 | Shimada et al. | |
| 2009/0190651 A1 | 7/2009 | Yoneya | |
| 2017/0005646 A1 | 1/2017 | Hargreaves | |
| 2018/0212525 A1 | 7/2018 | Beltran et al. | |
| 2019/0089286 A1* | 3/2019 | Toba | H02M 1/32 |

* cited by examiner

*Primary Examiner* — Vineeta S Panwalkar
(74) *Attorney, Agent, or Firm* — Design IP

(57) ABSTRACT

A pulse-width modulation (PWM) output stage includes a data source configured to generate a data signal; and a pulse-width modulator configured to sample the data signal at a plurality of sampling times and generate a PWM signal based on a plurality of data samples corresponding to the plurality of sampling times. The PWM signal includes a PWM cycle having a first phase of a first duration and a second phase of a second duration. The pulse-width modulator is configured to sample a first data sample at a first sampling time prior to the first phase, set the first duration and the second duration of the PWM cycle based on the first data sample, sample a second data sample at a second sampling time during the second phase, and adjust the second duration of the first PWM cycle based on the second data sample.

26 Claims, 2 Drawing Sheets

PULSE-WIDTH MODULATION WITH REDUCED TRANSMISSION LATENCY

FIELD

The present disclosure relates generally to pulse-width modulators and to methods for pulse-width modulation (PWM).

BACKGROUND

The many applications for pulse-width modulation (PWM) include voltage regulation, power-level control, and motor control, just to name a few. Each PWM period (i.e., transmission cycle) includes a high time for the first portion of the PWM period followed by a low time for a second portion of the PWM period, or vice versa. The duration of the first and second portions are regulated by a pulse-width modulator, which is typically a PWM circuit or processor.

PWM is widely used to transmit sensor data due to its simplicity. However, it has a severe disadvantage which is the long time that is needed to transmit a single value. This latency issue increases exponentially with the required resolution of the data transmission. The reception of the data is significantly delayed with respect to the sampling time. This delay sets a restriction to the achievable speed of a control loop that utilizes the sensor data.

Therefore, it may be desirable to develop a pulse-width modulator and a PWM method that reduces the transmission latency.

SUMMARY

One or more embodiments provide a pulse-width modulation (PWM) output stage that includes a data source configured to generate a data signal; and a pulse-width modulator configured to sample the data signal at a plurality of sampling times and generate a PWM signal based on a plurality of data samples corresponding to the plurality of sampling times. The PWM signal includes a plurality of PWM cycles, each comprising a first phase of a first duration and a second phase of a second duration. The first duration and the second duration are variable. The plurality of PWM cycles includes a first PWM cycle. The pulse-width modulator is configured to sample a first data sample at a first sampling time prior to the first phase of the first PWM cycle, set the first duration and the second duration of the first PWM cycle based on a first data value of the first data sample, sample a second data sample at a second sampling time during the second phase of the first PWM cycle, and adjust the second duration of the first PWM cycle based on a second data value of the second data sample.

One or more embodiments provide a PWM method, including: generating a data signal; sampling the data signal at a plurality of sampling times; and generating a PWM signal based on a plurality of data samples corresponding to the plurality of sampling times, where the PWM signal comprises a plurality of PWM cycles, each including a first phase of a first duration and a second phase of a second duration, wherein the first duration and the second duration are variable, where the plurality of PWM cycles includes a first PWM cycle. Sampling the data signal at the plurality of sampling times includes: sampling a first data sample at a first sampling time prior to the first phase of the first PWM cycle, and sampling a second data sample at a second sampling time during the second phase of the first PWM cycle. Generating the PWM signal includes setting the first duration and the second duration of the first PWM cycle based on a first data value of the first data sample, and adjusting the second duration of the first PWM cycle based on a second data value of the second data sample.

BRIEF DESCRIPTION OF THE DRAWINGS

Embodiments are described herein making reference to the appended drawings.

DETAILED DESCRIPTION

Figure 1A:
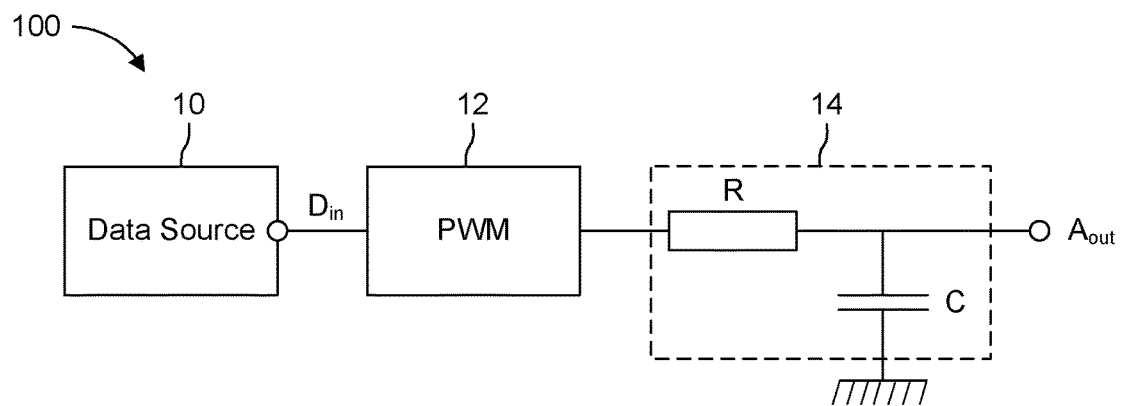
FIG. 1A is a schematic block diagram of a system in which a pulse-width modulator is used according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

A sensor may refer to a component which converts a physical quantity to be measured to an electric signal, for example, a current signal or a voltage signal. The physical quantity may, for example, be a current or a voltage at a shunt resistor in a single-shunt resistor system.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

FIG. 1A is a schematic block diagram of a system 100 in which a pulse-width modulator is used according to one or more embodiments. The system includes a data source 10, a pulse-width modulator 12, an RC circuit 14, and an analog output Aout. The data source 10 may be a sensor that is configured to generate a sensor signal (i.e., a data signal) in response to measuring a physical quantity such as temperature, pressure, magnetic field, voltage, current, etc. The pulse-width modulator 12 includes an input Din that receives the sensor signal. The pulse-width modulator 12 samples the sensor signal received at input Din at predetermined intervals, and generates a PWM signal based on the received data. In particular, each PWM period of the PWM signal corresponds to two or more data samples, as will be described in further detail below.

The RC circuit 14 is a low-pass filter (LPF) that converts the PWM signal into an analog signal. As such, an analog signal is output from the RC circuit 14 via the analog output Aout. The analog signal is an averaged signal representative of an average of multiple PWM periods or cycles.

The pulse-width modulator 12 may be used to transmit data from a sensor to a microcontroller (not illustrated) of an electronic control unit (ECU). In this case, it is also used to replace an analog signal, which are extremely sensitive to electromagnetic interference (EMI) and thus require huge and expensive linear output drivers. The PWM signal is transmitted in binary coding using the pulse-width modulator 12 and can be converted into an analog signal using the RC circuit 14 on the receiving side. The pulse-width modulator 12 drives the switching of the PWM signal to either voltage supply or ground and thus only needs minimal chip area compared to a linear output stage for the analog signal. Thus, the system 100 may be an output stage of communication interface.

Figure 1B:
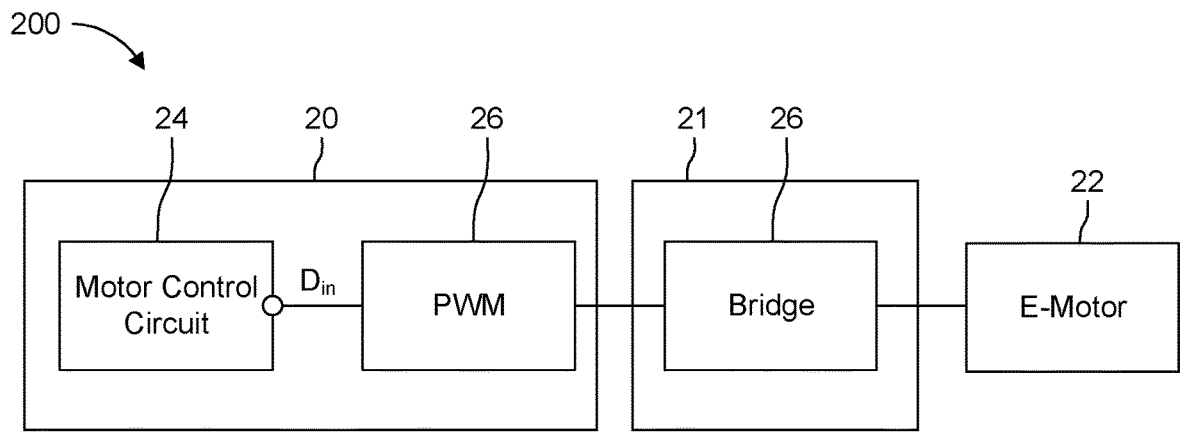
FIG. 1B is a schematic block diagram of another system in which a pulse-width modulator is used according to one or more embodiments.

FIG. 1B is a schematic block diagram of a system 200 in which a pulse-width modulator is used according to one or more embodiments. The system 200 may include an inverter control unit 20, a power inverter 21, and an electric motor 22. The inverter control unit 20 behaves as a motor control unit for controlling the electric motor 22. The power inverter 21 may include a transistor bridge configured to, for example, provide three-phase power by supplying three phase voltages to drive the electric motor 22. The inverter control unit 20 includes a motor control circuit 24, such as microcontroller that implements a motor control algorithm, and a pulse-width modulator 26 that transmits PWM control signals to a gate driver that controls the switching array of transistor bridge.

In this case, the motor control circuit 24 is a data source that generates a data signal in accordance with the motor control algorithm, and the data signal is received at the input Din of the pulse-width modulator 26. The pulse-width modulator 26 samples the data signal received at input Din at predetermined intervals, and generates a PWM control signal based on the received data. In particular, each PWM period of the PWM control signal corresponds to two or more data samples, as will be described in further detail below. Thus, the system 200 may be an output stage used in power applications.

It is noted that a low pass filter that smooths the switched current signal is not needed since the smoothing is accomplished by the mechanical inertia of the electric motor 22.

According to the embodiments, a second sampling time is introduced shortly before the end of each PWM period and allows to modify the PWM period time to represent the actual value of the measured signal at this second sampling time. In other words, while two or more data samples are taken for each PWM period or transmission cycle, the data content of a PWM period is representative of the latest data sample of those samples since the duration or length of each PWM period is variable (i.e., updated) in accordance with the latest data sample.

According to this method, a first data sample is taken or captured by the pulse-width modulator 12, 26 at a start of a PWM period to set initial high and low times of the PWM pulse. Additionally, a second data sample is taken during the PWM period (i.e., prior to the end of the same PWM period) to modify the high time or the low time, whichever comes later, of the PWM pulse. Thus, the length of the second phase of a PWM signal is updated based on a new, second data sample that is taken shortly before the end of the duration of the original PWM signal that was established by the first data sample. This has an effect of modifying the overall PWM data content and PWM period time of the PWM pulse.

Figure 2:
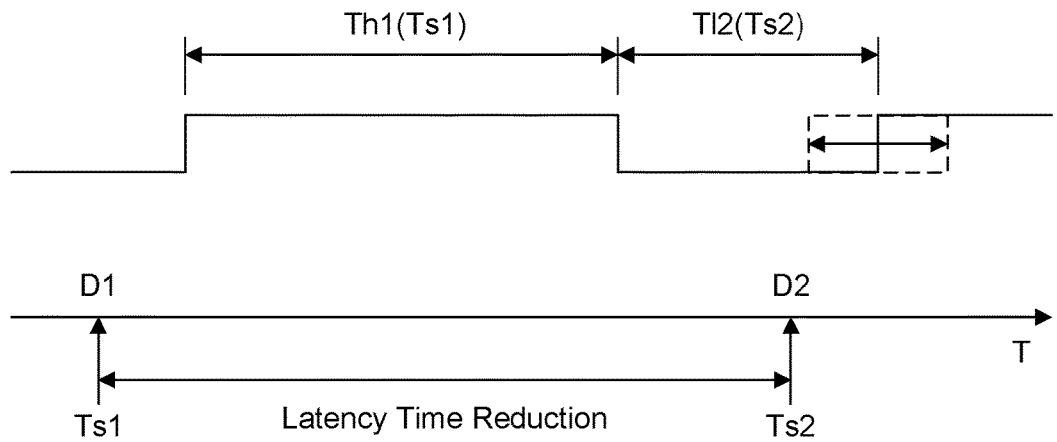
FIG. 2 is a signal diagram of a PWM signal of a PWM transmission cycle according to one or more embodiments.

FIG. 2 is a signal diagram of a PWM transmission cycle of a PWM signal according to one or more embodiments. The PWM transmission cycle or PWM period includes two portions: a first phase followed by a second phase. The first phase is defined by either a high time or a low time during which the PWM is a logic high value or a logic low value, respectively. The second phase is defined by either a low time or a high time, the value of which is complementary to the first phase. For FIG. 2, the following variables are defined:

D1: initial data sample;
Ts1: sampling time of initial data sample D1;
Tp1: initial PWM time period;
Th1: initial high time based on D1 and Tp1;
Tl1: initial low time based on D1 and Tp1;
D2: second data sample;
Ts2: sampling time of second data sample D2;
Tl2: updated low time based on D2; and
Tp2: updated PWM time period based on Th1 and Tl2.

It is also noted that a signal range for the following examples normalized to [−1, 1]. However, it will be appreciated that a different normalization range may be used or that normalization may not be used at al. Under this normalization scheme, the initial PWM time period is equal to 1 (i.e., Tp1=1). It will be further appreciated that it is also possible to initially start with a low time and then transition to a high time and that the embodiments are not limited to starting with a high time or a low time.

It is also noted that PWM signals in a data transmission system such as that shown in FIG. 1A cannot allow the high and low period to extend to the full PWM cycle length, since that would result in no detectable edges for the receiver used for distinguishing between data values. Thus, in this case, the high and low period are generated between small limits, such as between 5% to 95% of the full PWM period to provide detectable edged between PWM cycles. Thus, the allowed values for the initial high time or initial low time may be limited to set range of values smaller than the full range of values of a PWM cycle. For example, the full normalized range of the PWM cycle may be between −1 and 1 (inclusive) and the range of allowed values for the initial high time or initial low time may be between −0.9 to 0.9 (inclusive). Thus, the initial data sample D1 may be sampled prior to the PWM cycle start point or after the PWM cycle start point but prior to the first phase start point. For a motor control (e.g. Permanent Magnet Synchronous Motor (PMSM)) this is not the case, here the first and second phases can extend to 0 or 100% full PWM cycle length.

Accordingly, at a first sampling time Ts1 prior to first phase of a corresponding PWM transmission cycle, a data value D1 is sampled by the pulse-width modulator 12, 26 and the pulse-width modulator 12, 26 calculates the initial high time Th1 with respect to the initial period time Tp1 based on the data value D1. For example, the pulse-width modulator 12, 26 may use the Equation 1 to calculate the initial high time Th1 with respect to the initial period time Tp1 based on the data value D1:

$$Th1 = \frac{Tp1*(D1+1)}{2} \qquad \text{Eq. 1}$$

It naturally follows that the initial low time Tl1 with respect to the initial period time Tp1 can also be determined according to Equation 2:

$$Tl1=Tp1-Th1 \qquad \text{Eq. 2}$$

As a result of the initial calculation, the PWM signal transitions to high at a start of the corresponding PWM transmission cycle and remains high for the calculated time Th1. After the high time Th1 is over, the PWM signal returns to low.

At a defined time during the initial low time Tl1 and prior to the end of the initial period time Tp1 of the current PWM transmission cycle that is in progress, a second data sample D2 of the data signal is taken by the pulse-width modulator 12, 26 at sampling time Ts2. The pulse-width modulator 12, 26 uses the value of the second data sample to adjust the initial low time Tl1 and thus adjust the initial period time Tp1 of the current PWM transmission cycle during its transmission. In other words, the pulse-width modulator 12, 26 updates the initial low time Tl1 to an updated low time Tl2 and updates the initial PWM time period Tp1 to an updated PWM time period Tp2 based on the value of the second data sample D2. As a result, the second data sample D2 is represented by the ratio of the previously sent high time Th1 and the new adapted period time Tp2 which is the sum of the passed high time Th1 and the adjusted low time Tl2. For example, the updated low time Tl2 and the updated PWM time period Tp2 may be calculated using Equations 3 and 4:

$$Tl2 = \frac{2*Th1}{D2+1} - Th1, \qquad \text{Eq. 3}$$

$$Tp2 = Th1 + Tl2. \qquad \text{Eq. 4}$$

As a result, a single PWM transmission cycle is used to transmit the latest of two data samples D1 and D2, where data sample D1 is sampled prior to the PWM transmission cycle and data sample D2 is sampled during the PWM transmission cycle. Once the PWM signal is updated based on data sample D2, the first data sample D1 is overwritten. Thus, the final value conveyed by the PWM transmission cycle is representative of data sample D2.

Example 1, provided below, provides one possible outcome when the pulse-width modulator 12, 26 applies this PWM transmission method with the initial calculations for the start of the PWM transmission based on initial sample D1.

$D1 = 0.9$     $Tp1 = 1$     Initial period time, $Th1 = \frac{Tp1*(D1+1)}{2}$     $Th1 = 0.95$ Initial high time, $Tl1 = Tp1 - Th1$     $Tl1 = 0.05$ Initial low time.

Update the calculation with new sample D2 before the end of the PWM transmission: D2=0.8. Since the high state is already transmitted, the low state time is updated to Tl2:

$Tl2 = \frac{2*Th1}{D2+1} - Th1$    $Tl2 = 0.106$ Updated low time, $Tp2 = Th1 + Tl2$     $Tp2 = 1.056$ Updated period time.

This is a good result since the period time must only increase by 5.6%, which is feasible with a second sampling time taken shortly before the end of the PWM period. However, a possible disadvantage of the applied method is that for very short high times the required change of the period time has to change massively with a significant impact on the sampling rate. Thus, the PWM transmission method can be further adapted according to the following methods.

Figure 3:
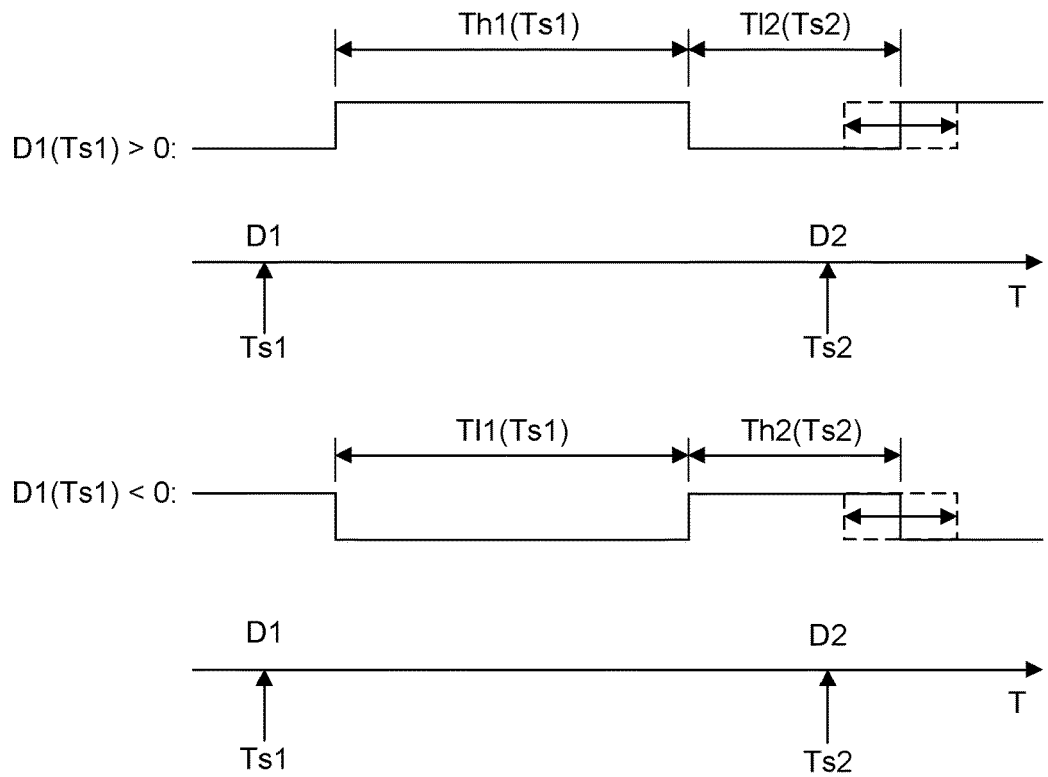
FIG. 3 is a signal diagram of two possible PWM signals of a PWM transmission cycle according to one or more embodiments in which two data samples are used.

FIG. 3 is a signal diagram of two possible PWM signals of a PWM transmission cycle according to one or more embodiments. In particular, FIG. 3 includes a top diagram illustrating a case in which the data value of the initial data sample D1 is a positive value and includes a bottom diagram illustrating a case in which the data value of the initial data sample D1 is a negative value, with respect to the normalized data range from −1 to +1.

In an adapted PWM transmission method, the PWM signal is transmitted with the longer state first. This means for positive data values of D1 where the high state is longer, the high state is transmitted first in the PWM transmission cycle followed by the low state. In the alternative, for a negative data value of D1 that requires a longer low state, the PWM transmission cycle starts in the low state followed by the high state.

Thus, the pulse-width modulator 12, 26 samples the first data sample D1 at the initial sampling time Ts1 and compares the data value of the first data sample D1 to zero or some other predefined threshold. On a first condition that the data value of the first data sample D1 is greater than the predefined threshold, the pulse-width modulator 12, 26 selects the high state for the first phase of the PWM transmission cycle. On a second condition that the data value of the first data sample D1 is less than the predefined threshold, the pulse-width modulator 12, 26 selects the low state for the first phase of the PWM transmission cycle.

When the first condition is satisfied, the pulse-width modulator 12, 26 samples the second data sample D2 during the second phase of the PWM transmission cycle (i.e., during the low state) at Ts2 and adjusts the duration of the low state according to the data value of the second data sample D2. In this case, Equations 1-4 may be applied as described above.

When the second condition is satisfied, the pulse-width modulator 12, 26 samples the second data sample D2 during the second phase of the PWM transmission cycle (i.e., during the high state) at Ts2 and adjusts the duration of the high state according to the data value of the second data sample D2. In this case, Equations 1 and 2 may be applied to calculate the initial values of Th1 and Tl1. However, additional Equations 5 and 6 are used to calculate the updated values of Th2 and Tp2:

$$Th2 = \frac{Ti1 + D2 * Tl1}{D2 - 1}, \qquad \text{Eq. 5}$$

$$Tp2 = Th2 + Tl1. \qquad \text{Eq. 6}$$

As a result, a single PWM transmission cycle is used to transmit the second data sample D2, where data sample D1 is used to set initial values of the PWM signal of the PWM transmission cycle and data sample D2 is sampled during the PWM transmission cycle and is used to set the final value of the PWM signal. Data sample D1 may be taken during a previous PWM cycle, close to the start of the next PWM cycle that corresponds to D2. Alternatively, data sample D1 may be taken between consecutive or adjacent PWM cycles (i.e., between a previous PWM cycle and a next PWM cycle). Alternatively, data sample D1 may be taken during its corresponding PWM transmission cycle, but prior to first phase of a the PWM transmission cycle. In the latter case, there may be some buffer period between the beginning of the corresponding PWM transmission cycle and the first phase (i.e, prior to the first transition edge).

Example 2, provided below, provides one possible outcome when the pulse-width modulator 12, 26 applies this adapted PWM transmission method with the initial calculations for the start of the PWM transmission based on initial sample D1.

$$D1 = -0.9 \qquad Tp1 = 1 \qquad \text{Initial period time}$$

$$Th1 = \frac{Tp1 * (D1 + 1)}{2} \qquad Th1 = 0.05 \qquad \text{Initial high time}$$

$$Tl1 = Tp1 - Th1 \qquad Tl1 = 0.95 \qquad \text{Initial low time}$$

Because the data value of D1 is less than the predefined threshold, the PWM transmission starts with the low state according to Tl1. The pulse-width modulator 12, 26 then updates the calculation with the new data sample D2 before the end of the PWM transmission: D2=−0.8. Since the low state is transmitted already the high state time is updated to Th2

$$Th2 = \frac{Tl1 + D2 * Tl1}{D2 - 1} \qquad Th2 = 0.106 \qquad \text{Updated low time}$$

$$Tp2 = Th2 + Tl1 \qquad Tp2 = 1.056 \qquad \text{Updated period time}$$

Due to the change in the order of the high phase and the low phase, the high phase only needs a small extension and the final period time Tp2 is increased by 5.6% with respect to the initial period time Tp1.

Figure 4:
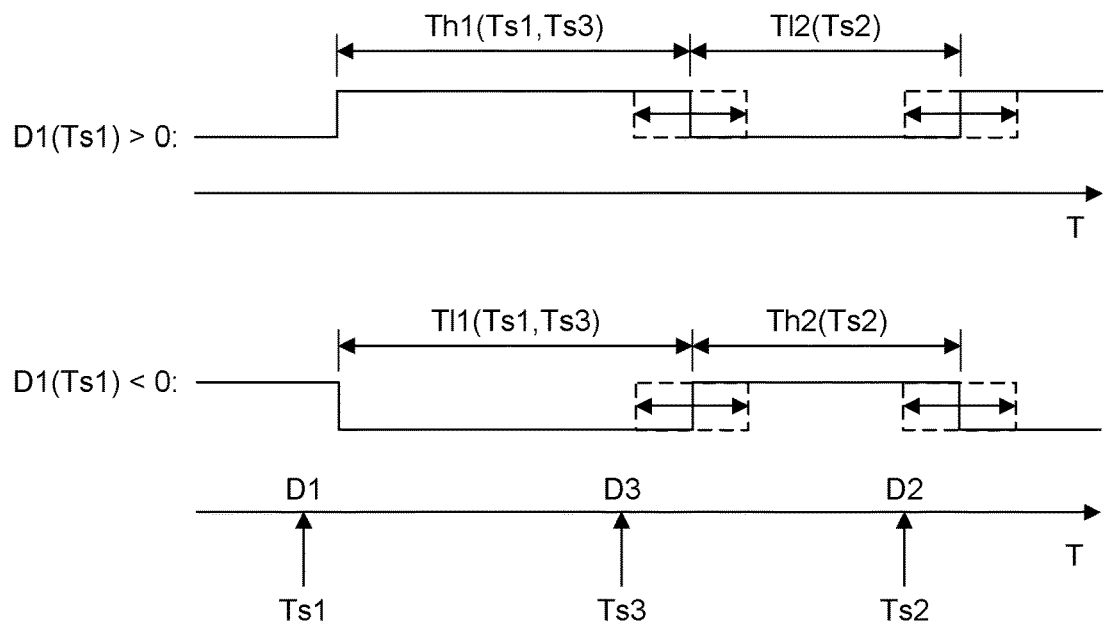
FIG. 4 is a signal diagram of two possible PWM signals of a PWM transmission cycle according to one or more embodiments in which three data samples are used.

In addition, the pulse-width modulator 12, 26 may be configured to take a third data sample D3 at sampling time Ts3 in order to adjust the duration of the first phase of the PWM transmission cycle. For example, FIG. 4 is a signal diagram of two possible PWM signals of a PWM transmission cycle according to one or more embodiments. In particular, FIG. 4 includes a top diagram illustrating a case in which the data value of the initial data sample D1 is a positive value and includes a bottom diagram illustrating a case in which the data value of the initial data sample D1 is a negative value. The pulse-width modulator 12, 26 uses data samples D1 and D2 in a manner similarly described above but also uses a third data sample D3 to adjust the duration of the first phase of the PWM transmission cycle.

When the first phase duration is modified in accordance with the third data sample D3, the complete set of durations Tl1, Th1 will be overwritten by Tl3, Th3 using Equations 1 and 2, with Tl1 replaced by Tl3 and Th1 replaced by Th3. The sum Tp3 of Tl3 and Th3 will stay equal to the initial time period Tp1. The calculation of the second phase duration does not need to be executed since it will be overwritten later anyhow. Due to the equality of Tp1 and Tp3, the sampling time Ts2 for the last sample D2 can remain the same and does not need to be changed. Since time periods Tp1 and Tp3 are equal, the change of the first phase duration based on D3 leads to an equal but opposite change of the second phase duration. The next modification based on data sample D2 at Ts2 will then change the second duration again according to the previous equations just with Tx1 (i.e., Tl1 and Th1) replaced by Tx3 (i.e., Tl3 and Th3). The second adjustment changes the period length Tp2 necessarily since the first period is already transmitted and cannot compensate the overall length of the period.

Accordingly, the total period length of the PWM transmission cycle may be initially set based on D1 and then adjusted based on D2. The first phase is initially set based on D1 and then updated based on D3. The second phase is initially set based on D1, then firstly adjusted based on D3 due to the adjustment made to the first phase, and then secondly adjusted based on D2. The total period length is only adjusted based on D2.

The sequence of operations may include: sample D1 at Ts1; determine whether to start the first phase of the PWM transmission cycle in a high state or a low state based on a comparison of sample D1 to zero or some other predefined threshold; calculate the initial period length of the first phase and the second phase based on D1; start the PWM transmission cycle according to the determined start state and the determined initial first phase and second phase durations; sample D3 at Ts3 during the first phase of the PWM transmission cycle; update the initial duration of the first phase based on D3 via adjustment; sample D2 at Ts2 during the second phase of the PWM transmission cycle; update the initial duration of the second phase based on D2 via adjustment.

Alternatively, the pulse-width modulator 12, 26 may use the values of data samples D1 and D3 to calculate an estimated data sample D2est that represents a predicted value of data sample D2 taken at Ts2. The pulse-width modulator 12, 26 may use the value of the estimated data sample D2est to adjust the initial duration of the first phase of the current PWM cycle instead of based on data sample D3 alone. For an oversampled signal, which must be the case if an analog signal shall be reconstructed by low pass filtering the PWM sequence, this will significantly reduce the required updates of the duration of the second PWM signal state.

The pulse-width modulator 12, 26 may use a linear predictor model using Equations 7 and 8 to calculate the estimated data sample D2est. In cases in which samples times Ts1, Ts3, and Ts2 are not equidistant, Equation 7 may be used. In cases in which samples times Ts1, Ts3, and Ts2 are equidistant, Equation 8 may be used.

$$D2est = D3 + \frac{D3 - D1}{t3 - t1} * (t2 - t3), \quad \text{Eq. 7}$$

$$D2est = 2 * D3 - D1. \quad \text{Eq. 8}$$

Data sample D2, taken by the pulse-width modulator 12, 26 at sample time Ts2, then overwrites the estimated data sample D2est and the pulse-width modulator 12, 26 uses the data sample D2 to adjust the initial duration of the second phase of the current PWM cycle.

Accordingly, the total period length of the PWM transmission cycle may be initially set based on D1 and then adjusted based on D2. The estimated data sample D2est is used to overwrite the initial values of Th1 and Tl1, while keeping Tp1 the same—much like the process described above for D3. Thus, the first phase is initially set based on D1 and then updated based on D2est. The second phase is initially set based on D1, then firstly adjusted based on D2est due to the adjustment made to the first phase, and then secondly adjusted based on D2est. The total period length is only adjusted based on D2.

The sequence of operations may include: sample D1 at Ts1; determine whether to start the first phase of the PWM transmission cycle in a high state or a low state based on a comparison of sample D1 to zero or some other predefined threshold; calculate the initial period length of the first phase and the second phase based on D1; start the PWM transmission cycle according to the determined start state and the determined initial first phase and second phase durations; sample D3 at Ts3 during the first phase of the PWM transmission cycle; calculate estimated data sample D2est based on samples D1 and D3; update the initial duration of the first phase based on D2est via adjustment; sample D2 at Ts2 during the second phase of the PWM transmission cycle; update the initial duration of the second phase based on D2 via adjustment.

Updating the initial duration of the first phase based solely on D3 or based on D2est will help keep later adjustment of the second phase that will finally be done based on the measured value for D2 as small as possible and thereby reduce the transmission latency. The smaller the maximum change of the second phase duration can be, the closer the second sample can be to the end of the PWM cycle and thus the latency is minimized.

A further advantage of the disclosed embodiments is that the period length of the PWM cycle is not constant and thus the spectral distribution peaks at 1/Tp1 is reduced by spectral spreading, where Tp is the initial PWM period time.

While not limited thereto, the disclosed embodiments may be used in systems that include linear sensors with a PWM interface for the emulation of analog signals and in motor bridge drivers for a Permanent Magnet Synchronous Motor (PMSM), as described in reference to FIGS. 1A and 1B, respectively.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Depending on certain implementation requirements, embodiments provided herein can be implemented in hardware or in software. The implementation can be performed using a digital storage medium, for example a floppy disk, a DVD, a Blue-Ray, a CD, a RAM, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A control unit including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes a computer program to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A pulse-width modulation (PWM) output stage, comprising:
    a data source configured to generate a data signal; and
    a pulse-width modulator configured to sample the data signal at a plurality of sampling times and generate a PWM signal based on a plurality of data samples corresponding to the plurality of sampling times,
    wherein the PWM signal comprises a plurality of PWM cycles, each comprising a first phase of a first duration and a second phase of a second duration,
    wherein the first duration and the second duration are variable,
    wherein the plurality of PWM cycles includes a first PWM cycle, and
    wherein the pulse-width modulator is configured to sample a first data sample at a first sampling time prior to the first phase of the first PWM cycle, set the first duration and the second duration of the first PWM cycle based on a first data value of the first data sample, sample a second data sample at a second sampling time during the second phase of the first PWM cycle, and adjust the second duration of the first PWM cycle based on a second data value of the second data sample.

2. The PWM output stage of claim 1, wherein the second data value is represented by a ratio of the first duration of the first PWM cycle and a sum of the first duration of the first PWM cycle and the adjusted second duration of the first PWM cycle.

3. The PWM output stage of claim 1, wherein:
    an initial PWM time period of the first PWM cycle is equal to a sum of the first duration and the second duration of the first PWM cycle, and
    an adjusted PWM time period of the first PWM cycle is equal to a sum of the first duration and the adjusted second duration of the first PWM cycle.

4. The PWM output stage of claim 1, wherein the pulse-width modulator is further configured to:
    compare the first data value to a predefined threshold,
    set the PWM signal to a first state during the first phase of the first PWM cycle and to a second state during the second phase of the first PWM cycle on a first condition that the first data value is greater than the predefined threshold, wherein the first state is a high state or a low state, and wherein the second state is a state opposite to the first state, and
    set the PWM signal to the second state during the first phase of the first PWM cycle and to the first state during the second phase of the first PWM cycle on a second condition that the first data value is less than the predefined threshold.

5. The PWM output stage of claim 4, wherein the pulse-width modulator is further configured normalize the plurality of data samples.

6. The PWM output stage of claim 1, wherein the pulse-width modulator is further configured to set the second sampling time at a predetermined time between an end of the first duration and an end of the second duration of the first PWM cycle.

7. The PWM output stage of claim 4, wherein the pulse-width modulator is further configured to:
    sample a third data sample at a third sampling time during the first phase of the first PWM cycle, and
    adjust the first duration of the first PWM cycle based on a third data value of the third data sample.

8. The PWM output stage of claim 7, wherein:
    an initial PWM time period of the first PWM cycle is equal to a sum of the first duration and the second duration of the first PWM cycle, and
    an adjusted PWM time period of the first PWM cycle is equal to a sum of the adjusted first duration and the adjusted second duration of the first PWM cycle.

9. The PWM output stage of claim 7, wherein the pulse-width modulator is further configured to:
- calculate an estimated data sample based on the first data sample and the third data sample, and
- adjust the first duration of the first PWM cycle based on a data value of the estimated data sample.

10. The PWM output stage of claim 9, wherein the estimated data sample is a predicted data value of the second data sample to be taken at the second sampling time.

11. The PWM output stage of claim 1, wherein the pulse-width modulator is further configured to:
- sample a third data sample at a third sampling time during the first phase of the first PWM cycle, and
- adjust the first duration of the first PWM cycle based on a third data value of the third data sample.

12. The PWM output stage of claim 1, wherein a total PWM time period of each of the plurality of PWM cycles is variable.

13. The PWM output stage of claim 1, wherein:
- the plurality of PWM cycles includes a second PWM cycle adjacently previous to the first PWM cycle, and
- the pulse-width modulator is configured to take the first data sample during the second phase of the second PWM cycle.

14. A pulse-width modulation (PWM) method, comprising:
- generating a data signal;
- sampling the data signal at a plurality of sampling times; and
- generating a PWM signal based on a plurality of data samples corresponding to the plurality of sampling times,
- wherein the PWM signal comprises a plurality of PWM cycles, each comprising a first phase of a first duration and a second phase of a second duration,
- wherein the first duration and the second duration are variable,
- wherein the plurality of PWM cycles includes a first PWM cycle,
- wherein sampling the data signal at the plurality of sampling times comprises:
  - sampling a first data sample at a first sampling time prior to the first phase of the first PWM cycle, and
  - sampling a second data sample at a second sampling time during the second phase of the first PWM cycle, and
- wherein generating the PWM signal comprises:
  - setting the first duration and the second duration of the first PWM cycle based on a first data value of the first data sample, and
  - adjusting the second duration of the first PWM cycle based on a second data value of the second data sample.

15. The PWM method of claim 14, wherein the second data value is represented by a ratio of the first duration of the first PWM cycle and a sum of the first duration of the first PWM cycle and the adjusted second duration of the first PWM cycle.

16. The PWM method of claim 14, wherein:
- an initial PWM time period of the first PWM cycle is equal to a sum of the first duration and the second duration of the first PWM cycle, and
- an adjusted PWM time period of the first PWM cycle is equal to a sum of the first duration and the adjusted second duration of the first PWM cycle.

17. The PWM method of claim 14, wherein generating the PWM signal further comprises:
- comparing the first data value to a predefined threshold;
- setting the PWM signal to a first state during the first phase of the first PWM cycle and to a second state during the second phase of the first PWM cycle on a first condition that the first data value is greater than the predefined threshold, wherein the first state is a high state or a low state, and wherein the second state is a state opposite to the first state; and
- setting the PWM signal to the second state during the first phase of the first PWM cycle and to the first state during the second phase of the first PWM cycle on a second condition that the first data value is less than the predefined threshold.

18. The PWM method of claim 17, wherein generating the PWM signal further comprises normalizing the plurality of data samples.

19. The PWM method of claim 14, wherein sampling the data signal at the plurality of sampling times further comprises setting the second sampling time at a predetermined time between an end of the first duration and an end of the second duration of the first PWM cycle.

20. The PWM method of claim 17, wherein:
- sampling the data signal at the plurality of sampling times further comprises sampling a third data sample at a third sampling time during the first phase of the first PWM cycle, and
- generating the PWM signal further comprises adjusting the first duration of the first PWM cycle based on a third data value of the third data sample.

21. The PWM method of claim 20, wherein:
- an initial PWM time period of the first PWM cycle is equal to a sum of the first duration and the second duration of the first PWM cycle, and
- a second adjusted PWM time period of the first PWM cycle is equal to a sum of the adjusted first duration and the adjusted second duration of the first PWM cycle.

22. The PWM method of claim 20, wherein generating the PWM signal further comprises:
- calculating an estimated data sample based on the first data sample and the third data sample; and
- adjusting the first duration of the first PWM cycle based on a data value of the estimated data sample.

23. The PWM method of claim 22, wherein the estimated data sample is a predicted data value of the second data sample to be taken at the second sampling time.

24. The PWM method of claim 14, wherein:
- sampling the data signal at the plurality of sampling times further comprises sampling a third data sample at a third sampling time during the first phase of the first PWM cycle, and
- generating the PWM signal further comprises adjusting the first duration of the first PWM cycle based on a third data value of the third data sample.

25. The PWM method of claim 14, further comprising:
- varying a total PWM time period of each of the plurality of PWM cycles.

26. The PWM method of claim 14, wherein:
- the plurality of PWM cycles includes a second PWM cycle adjacently previous to the first PWM cycle, and
- the first sampling time takes place during the second phase of the second PWM cycle.

* * * * *